United States Patent [19]

Wang et al.

[11] Patent Number: 5,175,122
[45] Date of Patent: Dec. 29, 1992

[54] PLANARIZATION PROCESS FOR TRENCH ISOLATION IN INTEGRATED CIRCUIT MANUFACTURE

[75] Inventors: Ching-Tai S. Wang, Worcester; Gregory J. Grula, Charlton, both of Mass.

[73] Assignee: Digital Equipment Corporation, Maynard, Mass.

[21] Appl. No.: 723,209

[22] Filed: Jun. 28, 1991

[51] Int. Cl.$^5$ ............................................. H01L 21/76
[52] U.S. Cl. ..................................... 437/67; 437/228; 437/978; 148/DIG. 50
[58] Field of Search ........................ 437/67, 228, 978; 148/DIG. 50

[56] References Cited

U.S. PATENT DOCUMENTS

| 4,505,025 | 3/1985 | Kurosawa et al. | 437/67 |
| 5,077,234 | 12/1991 | Scoopo et al. | 437/67 |

FOREIGN PATENT DOCUMENTS

| 57-187951 | 11/1982 | Japan | 437/67 |
| 58-143548 | 8/1983 | Japan | 437/67 |
| 61-55939 | 3/1986 | Japan | 437/67 |
| 63-281441 | 11/1988 | Japan | 437/67 |
| 64-13727 | 1/1989 | Japan | 437/67 |
| 64-25433 | 1/1989 | Japan | 437/67 |

OTHER PUBLICATIONS

Daubenspeck et al., "Planarization of ULSI Topography over Variable Pattern Densities", J. Electrochem. Soc., Feb. 1991, pp. 506-509.
Fuse et al., "A New Isolation Method with Boron-Implanted Sidewalls for Controlling Narrow-Width Effect", IEEE Trans. on Electron Dev., Feb. '87, p. 356.
Shibata et al., "A Simplified Box (Buried-Oxide) Isolation Technology", IEDM, 1983, pp. 27-30.
Davari et al., "A Variable-Sized Shallow Trench Isolation (STI) Technology with Diffused Sidewall Doping for Submicron CMOS", IEDM '88, pp. 92-95.
Sheldon et al., "Application of a Two-Layer Planarization Process to ULSI Intermetal Dielectric and Trench Isolating Processes", IEEE Tr. on Semicond. Mfgs., 1988, pp. 140-145.
Schiltz et al., "Two-Layer Planarization process", J. Electro Chem Soc., Solid State Sci. and Tech., Jan. '86, pp. 178-181.
Yamabe et al., "Nonplanar oxidation and Reduction of Oxide Leakage Currents at Silicon Corners by Rounding-Off Oxidation", IEEE Tr. on Elect. Dev., Aug. '87, p. 1681.

Primary Examiner—Olik Chaudhuri
Assistant Examiner—G. Fourson
Attorney, Agent, or Firm—Arnold, White & Durkee

[57] ABSTRACT

A method of planarizing the surface of a silicon wafer of the type employing trench isolation is disclosed where the trenches and active areas of wafer surface may be of varying widths. The trenches and active areas are covered with a conformal coating of silicon oxide; and, according to one embodiment, this coating is subjected to an etch to leave sidewall spacers of oxide at the sidewalls of the trenches, then a second conformal coating of oxide is applied. A first layer of photoresist is applied to the face and patterned to leave photoresist only in the wider trenches. According to another embodiment the remaining photoresist of the first layer is reflowed by a heat treatment to account for any misalignment or the like. A second layer of photoresist is applied, then etched back to the conformal coating on the active areas, leaving some resist in narrow trenches. A third layer of photoresist is applied and then the three layers of photoresist plus oxide are simultaneously etched back to the level of the tops of the active areas, leaving a substantially planar surface where there is a minimum of variation in height in the various areas of differing trench and active area widths.

14 Claims, 4 Drawing Sheets

PLANARIZATION PROCESS FOR TRENCH ISOLATION IN INTEGRATED CIRCUIT MANUFACTURE

BACKGROUND OF THE INVENTION

This invention relates to semiconductor devices, and more particularly to a method of planarization in integrated circuit manufacture where trench isolation is employed.

Trench isolation is employed in manufacturing processes for integrated circuits to avoid the topographical uncertainties caused in using the more coventional thick field oxide isolation. Particularly, the growth of thermal field oxide using a mask such as nitride creates an encroachment of the oxide into the active areas, this encroachment being referred to as the bird's beak effect. Trench isolation technolgy, however, requires the use of a planarization process to remove oxide from the active areas and keep oxide in the trenches. Due to varying pattern densities, sufficient planarization is sometimes not achieved. In some areas of the wafer face, there will be narrow trenches with narrow active areas between them, in others there will be wide active areas and wider trenches, while various combinations of trench width and active area width occur at other places along the face of the wafer due to variations in circuit density.

Several techniques have been developed for planarization of wafer surfaces when employing trench isolation. For example conformal oxide deposition with etchback can produce local smoothing and planarization, but problems occur with this technique for wide trenches. Another technique uses spin-on photoresist or glasses followed by etchback, but again the smoothing is dependent upon the trench geometries, and global planarization is not achieved when variable circuit density is present.

The prior techniques have been able to produce adequate planarization over local regions, but not global planarization over large areas of diverse trench patterns. More nearly global planarization has been reported using a two-layer photoresist structure, in which the first layer is patterned to provide a uniform surface for coating by the second layer. The two-layer stack is etched back to the original level, leaving a planar surface. This two layer photoresist method can use a so-called planarization block mask, in which the first level is patterned to leave photoresist only in sufficiently wide trenches, increasing the degree of planarization achieved.

In copending application Ser. No. 545,858, filed Jun. 29, 1990, by Scoopo, Alvarez and Grula, for Planarization Process Utilizing Three Resist Layers, assigned to Digital Equipment Corporation, now U.S. Pat. No. 5,077,234, a method of planarizing a surface of a silicon wafer is disclosed which employs three successive photoresist layers. The first layer is patterned as discussed to leave photoresist only in the wider trenches, then the second and third layers are added, and etchback to the original silicon surface in the active areas provides a planar surface.

In spite of the improvements discussed in planarization methods, there are still variations in surface level in the resulting structures, in some situations, particularly when mask misalignment and lapses in critical dimension control occur.

SUMMARY OF THE INVENTION

In accordance with one embodiment of the invention, a method of planarizing the surface of a silicon wafer of the type employing trench isolation is provided where the trenches and active areas of wafer surface may be of varying widths. The trenches and active areas are covered with a conformal coating of silicon oxide, and, according to one embodiment, this coating is subjected to an etch to leave sidewall spacers of oxide at the sidewalls of the trenches, then a second conformal coating of oxide is applied. A first layer of photoresist is applied to the face and patterned to leave photoresist only in the wider trenches. According to another embodiment, the remaining photoresist of the first layer is reflowed by a heat treatment to account for any misalignment or the like. A second layer of photoresist is applied, then etched back to the conformal coating on the active areas, leaving some resist in narrow trenches. A third layer of photoresist is applied and then the three layers of photoresist plus oxide are simultaneously etched back to the level of the tops of the active areas, leaving substantially planar surface where there is a minimum of variation in height in the various areas of differing trench and active area widths.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENTS

Figure 1:
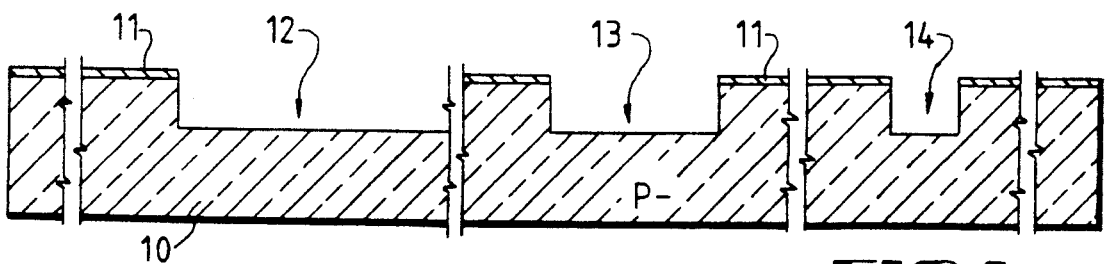
FIGS. 1 to 13 are elevation views in section of a small part of a silicon wafer at successive stages in the manufacture of a semiconductor device, particularly in the steps of planarizing a face of the wafer after trench etching and before formation of active devices.
Figure 2:
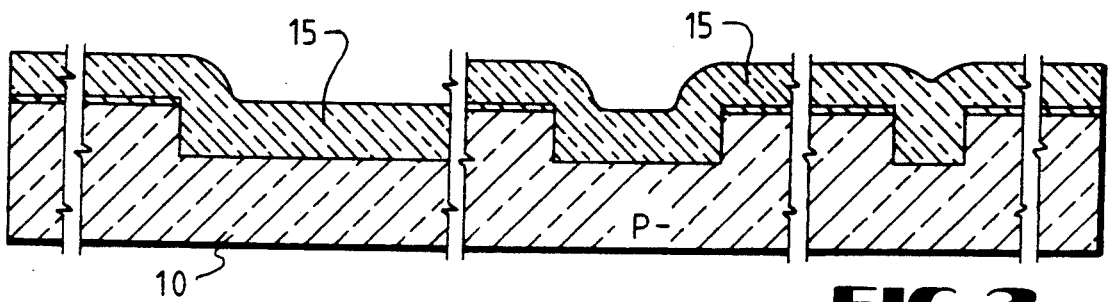

Referring to FIG. 1, the result of a trench-etch step in a method of isolation of active areas of a semiconductor wafer face is illustrated. A silicon wafer 10 has an etch mask 11 formed on its upper face by depositing silicon nitride (usually over a thermal oxide coating) and covering the nitride with photoresist, exposing the face to light through a mask defining the pattern of trenches, then developing to leave the mask 11 as seen. The face is subjected to an anisotropic etch such as a reactive ion etch (RIE) to create the trenches 12, 13 and 14. Three trenches 12, 13 and 14 of differing widths are illustrated to represent three distinct types of planarization problems. A wide active area with a wide trench such as the trench 12 on the left present one set of problems, while a smaller-sized active area with a narrower trench 13 presents other problems. A minimum-sized trench (e.g., less than one micron wide) presents the easiest fill situation, but may result in a higher level of oxide in the trenches. As seen in FIG. 2, the next step is deposition of a first conformal oxide coating, using a TEOS (tetraethylorthosilicate) deposition, for example, producing an oxide coating 15 of uniform thickness that coats the sidewalls of the trenches at the same thickness as the coating of the flat areas. In one example, this thickness is about 0.6 micron.

Figure 3:
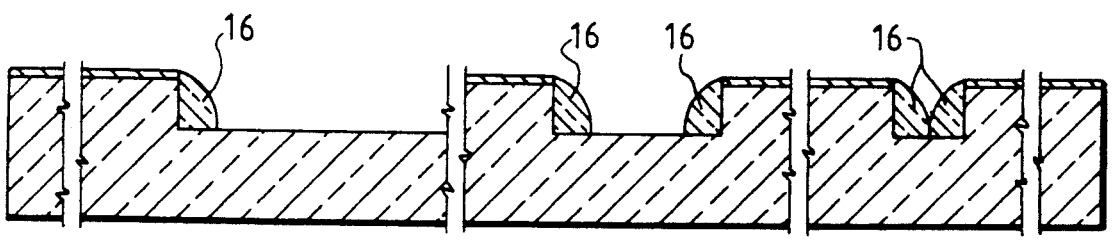

According to one feature of the invention, this conformal coating 15 is subjected to an anisotropic etch, using RIE, to leave sidewall spacers 16 as seen in FIG. 3. The width of these spacers is approximately that of the thickness of the conformal coating 15; the etch removes material only to roughly the depth of the coating. The effect of this sidewall spacer 16 is to widen the effective active areas and at the same time reduce the effective trench width with conformal slope, and hence will ultimately greatly improve the wafer surface planarity. Merely an additional etch step, with no mask needed, is used to provide these added advantages. If the width of the narrowest active area is 1.0 μm, for example, then the effective active area width will be increased to about 2.2 μm by the sidewall spacers 16. At the same time, trenches are reduced in width by the formation of the sidewall spacer.

Figure 4:
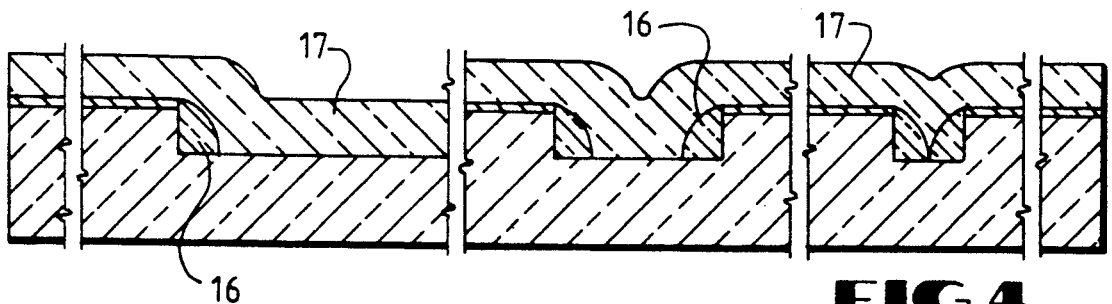

A second conformal coating 17 of deposited silicon oxide is applied over the face of the wafer as seen in FIG. 4, and this coating 17 will have steps with sidewalls of much less steep slopes due to the underlying sidewall spacers 16. The thickness of this coating 17 is about the same as that of the coating 15.

Figure 5:
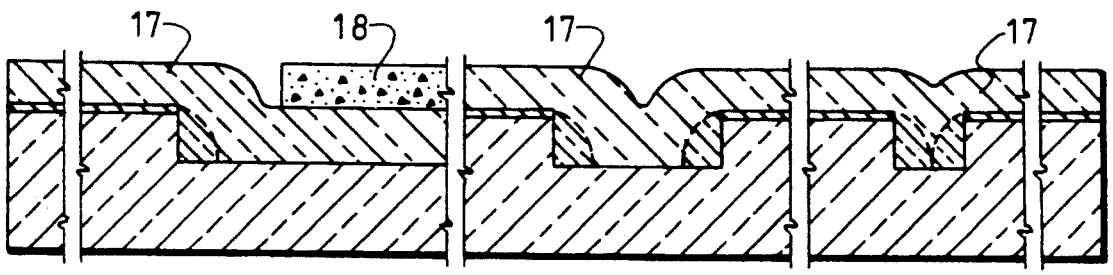
Figure 6:
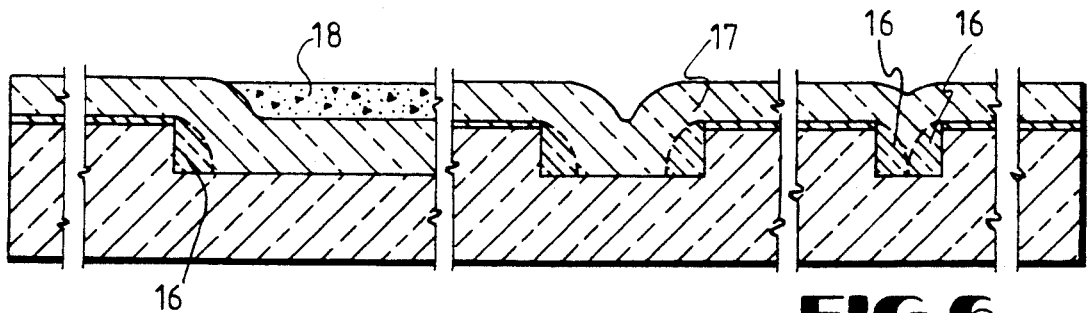

Referring to FIG. 5, the next step is the application of a photoresist coating 18 over the entire face and exposure to light through a mask to define a pattern of the wide trenches 12. After developing, the photoresist 18 is left only in the wide trenches. According to one feature of the invention, as discussed below, the photoresist 18 is subjected to a reflow treatment to reduce the effects of misalignment of the mask used to pattern this photoresist 18. Referring to FIG. 6, the photoresist 18 is reflowed by subjecting the photoresist to a heat treatment so that the trenches 12 are filled evenly to the level of surrounding oxide, leaving no gap at the step area as was true in the illustration of FIG. 5. A deep ultraviolet or DUV treatment is performed, leaving the wide trenches filled with hardened photoresist 18; the wafer heated to perhaps 200° C. while the ultraviolet light is impinged upon the wafer face, to perform this treatment.

Figure 7:
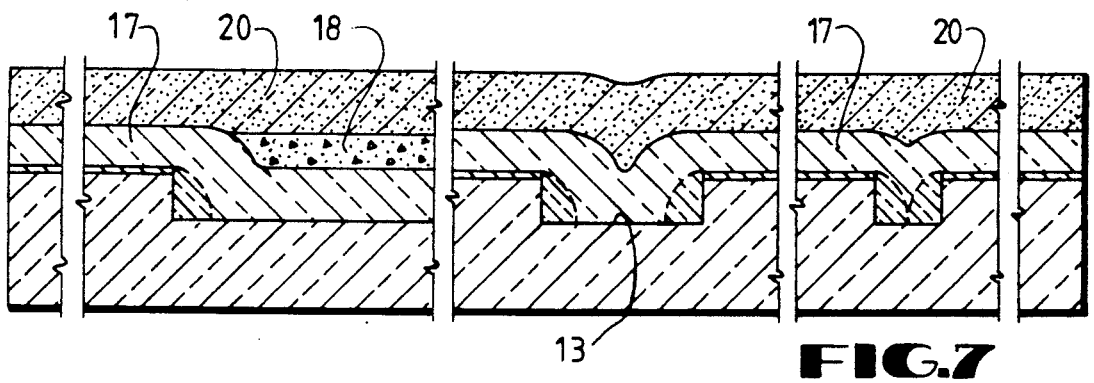

The next step is the application of a second resist coating 20 of photoresist as seen in FIG. 7. This coating covers the entire face evenly, and, due to the filler photoresist 18, is of an approximately planar surface configuration except for the depressions at the trenches 13. Also, the sidewall spacers aid in the degree of planarity at this point, because the resist thickness is dependent upon the width of the active area and the sidewall spacers have effectively widened the active areas. The thickness of this photoresist coating 20 is approximately the same as that of the oxide layer 17, which is approximately that of the trench depth of trenches 12, 13 and 14.

Figure 8:
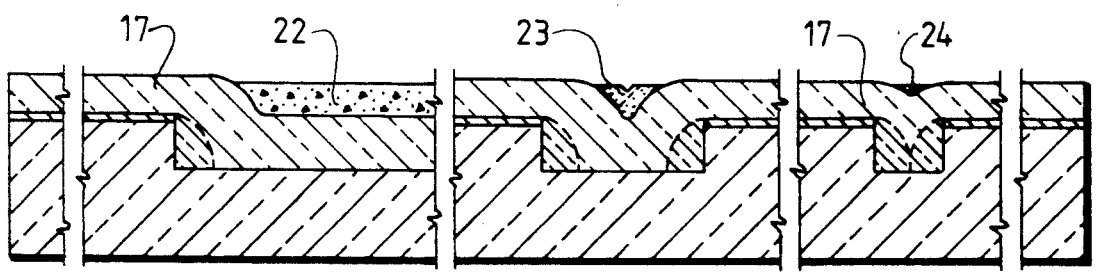
Figure 9:
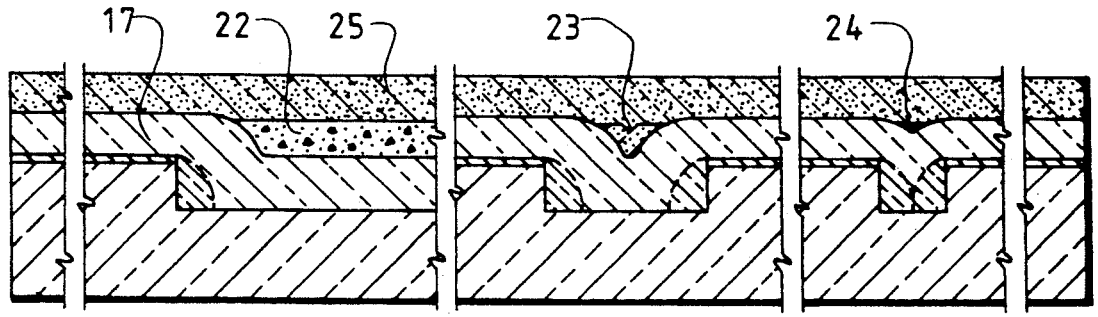

Referring to FIG. 8, an etchback of the photoresist coating 20 is performed, stopping when the conformal oxide 17 is reached. Then, another deep ultraviolet or DUV treatment is performed, leaving the wide trenches filled with hardened photoresist 22, and leaving the medium and narrow trenches 13 and 14 likewise partially filled with hardened photoresist 23 and 24. As seen in FIG. 9, a third coating 25 of photoresist is next applied to the face, just as the second coating 20. The face of the wafer is now relatively planar, with little difference between the level at the wide trenches and the narrower trenches.

Figure 10:
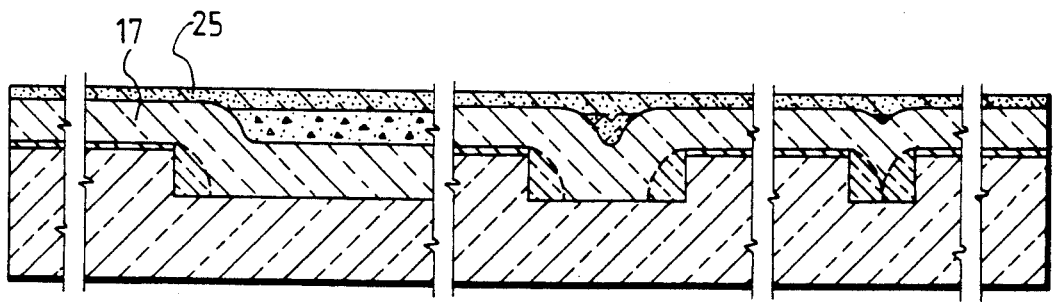
Figure 11:
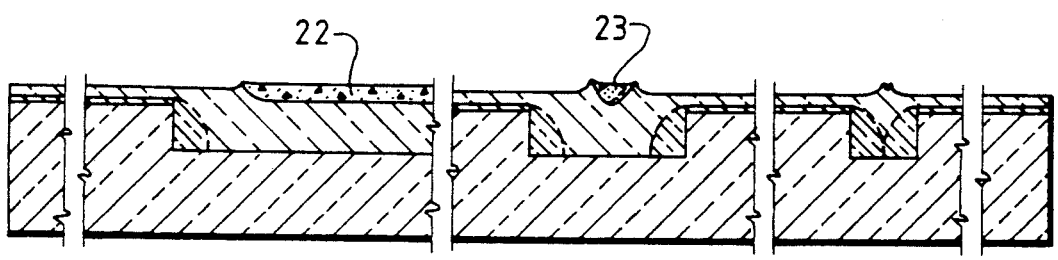
Figure 12:
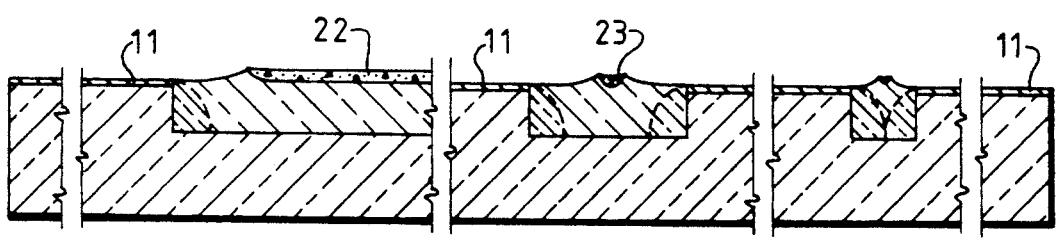

An etchback of the three layers of photoresist and the conformal oxide 17 is performed simultaneously as illustrated in FIG. 10. A first etch composition is selected for the initial part of this etchback so that only photoresist is removed, since there is no exposed oxide at this point. Then, before any oxide is exposed, the etch composition is changed to a second one which will remove both photoresist and oxide at the same rate, to preserve the planarity of the face achieved by the filler and two-step photoresist operations described above. Photoresist and oxide are removed up to a point so that the narrowest active areas have been almost cleared of oxide. At this point, the etch composition is changed to a third one which will remove oxide preferentially, and not photoresist, so removal of the face continues as seen in FIG. 11, with the oxide over the active areas now being etched. This is done to clear larger active areas of oxide; these same etch conditions will also etch nitride slower than oxide (which was not true of the second etch composition). After the nitride layer 11 has been reached as seen in FIG. 12, the etch is terminated, and the resist is stripped using a composition that removes photoresist but not oxide, leaving a structure as seen in FIG. 13.

Figure 13:
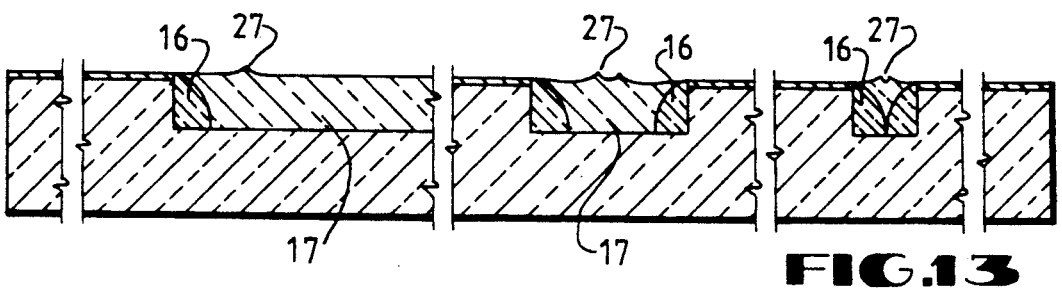

The final structure seen in FIG. 13 has peaks 27 of oxide in the field regions, occurring at the edges of where an oxide-to-photoresist interface was present. These peaks are of perhaps 1500 Å height, and may be partially removed by a wet etch before continued processing. Mechanical removal, as by polishing, may also be used to remove the tops of the peaks 27. Note, however, that the peaks of oxide are in the field areas rather than the active areas, and are substantially spaced from the edges of the active areas.

Figure 14:
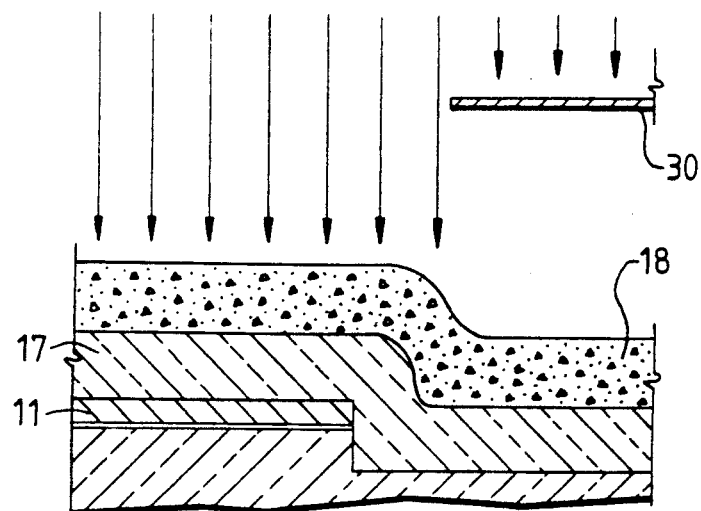
FIGS. 14-17 are detail views of parts of FIGS. 5 and 6 showing the formation of a planarization block mask, according to one embodiment.
Figure 15:
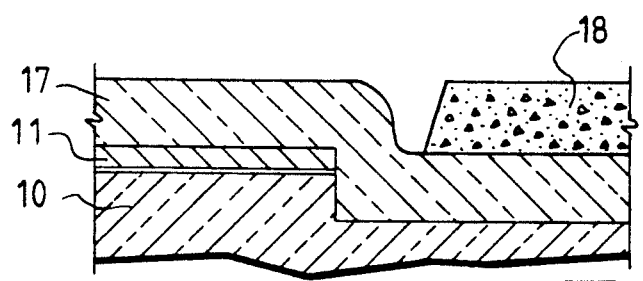
Figure 16:
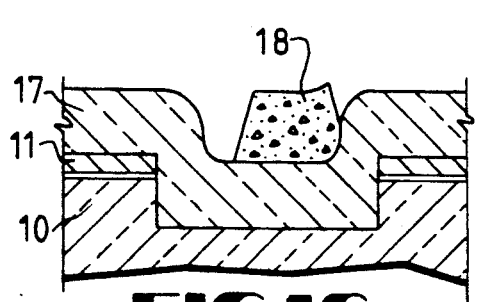
Figure 17:
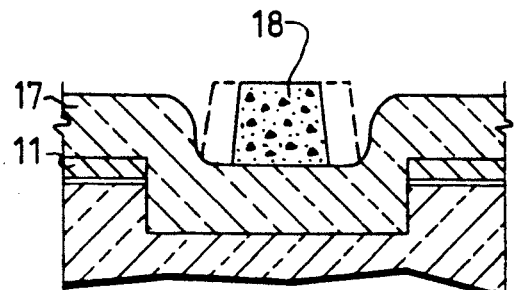

As mentioned above, one of the features of the invention is the reflow procedure used after the patterning of the photoresist 18 of FIG. 5. Referring to FIG. 14, in patterning the photoresist coating 18 of FIG. 5 it is exposed to light through a mask 30 which is supposed to be aligned with the edge of the sloped area of the layer 17 of oxide, i.e., at the bottom the sloping sidewall going into the trench 12. This mask 30 is a slightly resized reverse tone of the mask used to form the active areas, i.e., to form the trenches 12, 13 and 14. After developing, the resultant remaining photoresist coating 18 will be of about the configuration seen in FIG. 15. Due to misalignment of the mask 30, however, or due to critical dimension controls, or localized microtrenching (the trench between the coating 18 and the oxide 17) various problems can result as illustrated in FIGS. 16 and 17. These problems can all affect the wafer surface planarity in the final structure unless alleviated. It is for this reason that the reflow step is introduced as discussed above with reference to FIG. 6.

The advantages of using the reflow step of FIG. 6 are several. For the photolithographic operations, there is less critically on critical dimension control and misalignment, so the wafer rework rate will be reduced, thus reducing cost and increasing yield. For the etch operations, the more-planar the surface is to start with, the wider the process window will be, such as etch loading effect, etch uniformity and etch end point capability. Also, the planarization block mask 18 would ordinarily be of a thickness inversely proportional to the trench width (that, is the smaller trench width was, the thicker the block mask 18 would be). By reflowing the layer 18, the trench width dependency of the coating 18 thickness can be minimized.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of planarizing a face of a substrate or of a material deposited or grown on said substrate, comprising the steps of:
    etching trenches of various widths and of approximately equal depths in said face;
    forming a conformal coating of an insulator material on said face, coating the sidewalls of said trenches as well as flat surfaces in the trenches and between the trenches;
    etching said coating to leave sidewall spacers at the sidewalls of said trenches;
    forming a second conformal coating of the insulator material on said face, coating the spacers at said sidewalls of said trenches as well as flat surfaces in the trenches and between the trenches;
    depositing a first layer of photoresist over said second conformal coating and patterning said first layer of photoresist to leave said first layer of photoresist only in selected ones of said trenches, said selected ones having a width which is wider than other trenches of narrower width, the width of said selected ones leaving a substantial amount of the bottom of said selected ones not covered by said sidewall spacers after said step of etching said coating; said first layer having the top surface after said patterning at about the level of a top surface of said second conformal coating at said active areas;
    reflowing the remaining portions of said first layer of photoresist to fill any gaps at edges of said photoresist adjacent to the sidewalls;
    depositing a second layer of photoresist over said first layer of photoresist and over said second conformal coating;
    etching said second layer of photoresist to the level of the second conformal coating;
    depositing a third layer of photoresist;
    etching said layers of photoresist and said second conformal coating down to the level of tops of said flat areas between the trenches to leave a substantially planar surface.

2. A method according to claim 1 wherein said substrate is silicon, and said insulator material is silicon oxide.

3. A method according to claim 2 wherein said step of etching trenches includes forming an etch mask of silicon nitride on said face in a pattern to define said trenches.

4. A method according to claim 3 wherein said step of etching said first, second and third layers of photoresist includes stopping on said etch mask of silicon nitride.

5. A method of planarizing a face of a semiconductor body, comprising the steps of:
    etching trenches of various widths in said face to leave active areas of said face;
    forming a first conformal coating of insulator on said face, coating the sidewalls of said trenches as well as flat surfaces of the face in the trenches and between the trenches;
    etching said coating to leave sidewall spacers at the edges of said trenches;
    forming a second conformal coating of said insulator on said face, coating the spacers at said sidewalls of said trenches as well as flat surfaces of the face in the trenches and between the trenches;
    depositing a first layer of photoresist on said face over said second conformal coating and patterning said first layer to leave said layer only in first ones of said trenches, said first ones of said trenches being wider than certain other ones of said trenches, the width of said first ones leaving a substantial amount of the bottom of said first ones not covered by said sidewall spacers after said step of etching said coating; said first layer having a top surface after said patterning at about the level of the top surface of said second conformal coating at said active areas;
    reflowing said first layer of photoresist to fill any gaps at edges of said photoresist and to planarize the surface of said first layer of photoresist;
    depositing a second layer of photoresist over said face over said first layer of photoresist and over said second conformal coating;
    etching said second layer of photoresist to said second conformal coating to leave photoresist in said certain other ones of said trenches where said first layer is not present;
    depositing a third layer of photoresist on said face;
    etching said first, second and third layers of photoresist and said second conformal coating down to the level of tops of said active areas to leave a substantially planar surface for formation of devices in said active areas.

6. A method according to claim 5 wherein said semiconductor body is silicon, and said insulator is silicon oxide.

7. A method according to claim 6 wherein said step of etching trenches includes forming an etch mask of silicon nitride on said face in a pattern to define said trenches, and wherein said step of etching said first, second and third layers of photoresist includes stopping on said etch mask of silicon nitride.

8. A method of planarizing a face of a semiconductor body, comprising the steps of:
    etching trenches of various widths in said face to leave active areas of said face;
    forming a conformal coating of silicon oxide on said face, coating the sidewalls of said trenches as well as flat surfaces of the face in the trenches and between the trenches;
    depositing a first layer of photoresist on said face over said conformal coating and patterning said first layer to leave said layer only in first ones of said trenches, said first ones being wider than other ones of said trenches, the width of said first ones leaving a substantial amount of the bottom of said first ones not covered by said sidewall spacers after said step of etching said coating; said first layer having a top surface after said patterning being at about the level of the top surface of said conformal coating at said active areas;
    reflowing said first layer of photoresist to fill any gaps at edges of said photoresist and to planarize the surface of said first layer of photoresist;
    depositing a second layer of photoresist over said face over said first layer of photoresist and over said conformal coating;

etching said second layer of photoresist to said conformal coating to leave photoresist in said other ones of said trenches where said first layer is not present;

depositing a third layer of photoresist on said face;

etching said first, second and third layers of photoresist and said conformal coating down to the level of tops of said active areas to leave a substantially planar surface for formation of devices in said active areas.

9. A method according to claim 8 wherein said semiconductor body is silicon.

10. A method according to claim 9 wherein said step of etching trenches includes forming an etch mask of silicon nitride on said face in a pattern to define said trenches, and wherein said step of etching said first, second and third layers of photoresist includes stopping on said etch mask of silicon nitride.

11. A method of planarizing a face of a semiconductor body, comprising the steps of:

etching trenches of various widths in said face to leave active areas of said face; said trenches including first ones of a width which is wider than other ones of said trenches;

forming a conformal coating of insulator on said face, coating the sidewalls of said trenches as well as flat surfaces of the face in the trenches and between the trenches;

etching said conformal coating to leave sidewall spacers at the edges of said trenches; the width of said first ones leaving a substantial amount of the bottom of said first ones not covered by said sidewall spacers after said step of etching said coating;

forming a second conformal coating of insulator on said face, coating the spacers at said sidewalls of said trenches as well as any flat surfaces of the face in the trenches and between the trenches;

depositing a first layer of photoresist on said face over said second conformal coating and patterning said first layer to leave said layer only in said first ones of said trenches; said first layer of photoresist having a top surface after said patterning being at about the level of the top surface of said second conformal coating at said active areas;

depositing a second layer of photoresist over said face over said first layer of photoresist and over said conformal coating;

etching said second layer of photoresist to said second conformal coating to leave photoresist in narrower ones of said trenches where said first layer is not present;

depositing a third layer of photoresist on said face;

etching said first, second and third layers of photoresist and said second conformal coating down to the level of tops of said active areas to leave a substantially planar surface for formation of devices in said active areas.

12. A method according to claim 11 wherein said semiconductor body is silicon, and said insulator is silicon oxide.

13. A method according to claim 12 wherein said step of etching trenches includes forming an etch mask of silicon nitride on said face in a pattern to define said trenches, and wherein said step of etching said first, second and third layers of photoresist includes stopping on said etch mask of silicon nitride.

14. A method according to claim 11 including the step of reflowing said first layer of photoresist to fill any gaps at edges of said photoresist and to planarize the surface of said first layer of photoresist.

* * * * *

UNITED STATES PATENT AND TRADEMARK OFFICE
CERTIFICATE OF CORRECTION

PATENT NO. : 5,175,122
DATED : December 29, 1992
INVENTOR(S) : Wang et al

It is certified that error appears in the above-indentified patent and that said Letters Patent is hereby corrected as shown below:

Column 3, line 40, after "wafer" insert --is--.

Column 6, line 50 (Claim 8), after "trenches", insert --etching said coating to leave sidewall spacers at the sidewalls of siad trenches;--.

Signed and Sealed this

Eleventh Day of January, 1994

Attest:

BRUCE LEHMAN

*Attesting Officer*  *Commissioner of Patents and Trademarks*